United States Patent [19]

Kasahara

[11] Patent Number: 5,024,955
[45] Date of Patent: Jun. 18, 1991

[54] VARIABLE-CAPACITANCE DIODE ELEMENT HAVING WIDE CAPACITANCE VARIATION RANGE

[75] Inventor: Takeshi Kasahara, Saitama, Japan

[73] Assignee: Toko, Inc., Tokyo, Japan

[21] Appl. No.: 537,689

[22] Filed: Jun. 13, 1990

Related U.S. Application Data

[62] Division of Ser. No. 466,204, Jan. 17, 1990.

[30] Foreign Application Priority Data

Jan. 19, 1989 [JP] Japan .................................. 1-10885
Jan. 30, 1989 [JP] Japan .................................. 1-20496

[51] Int. Cl.$^5$ ........................ H01L 21/74; H01L 21/76
[52] U.S. Cl. .............................. 437/27; 148/DIG. 4; 437/30; 437/904
[58] Field of Search ............... 437/26, 27, 30, 904; 148/DIG. 4; 357/13, 14, 15

[56] References Cited

FOREIGN PATENT DOCUMENTS

| | | | |
|---|---|---|---|
| 55-083271 | 6/1980 | Japan ................................ | 437/904 |
| 55-156373 | 12/1980 | Japan ................................ | 357/14 |
| 56-69869 | 6/1981 | Japan ................................ | 357/14 |
| 56-078174 | 6/1981 | Japan ................................ | 357/14 |
| 56-094673 | 7/1981 | Japan ................................ | 357/14 |
| 58-69774 | 6/1983 | Japan ................................ | 437/27 |
| 59-201426 | 11/1984 | Japan ................................ | 148/DIG. 4 |
| 60-182132 | 9/1985 | Japan ................................ | 148/DIG. 4 |
| 61-040062 | 2/1986 | Japan ................................ | 357/13 |

Primary Examiner—Olik Chaudhuri
Assistant Examiner—Kenneth E. Horton

[57] ABSTRACT

A variable-capacitance diode element is disclosed which comprises a semiconductor substrate of a first conductivity type having an epitaxial layer of the first conductivity type provided on a main surface portion thereof, said epitaxial layer having a higher resistivity than that of said semiconductor substrate; a first diffusion layer of the first conductivity type diffused in said epitaxial layer and having a lower resistivity than that of said epitaxial layer; a second diffusion layer of a second conductivity type surrounded by said first diffusion layer and having a lower resistivity than that of said first diffusion layer; and a third diffusion layer of the second conductivity type of a small diffusion length covering an exposed portion of a major surface of said first diffusion layer and an exposed portion of a major surface of said second diffusion layer. With such construction, the capacitance variation range of the diode element is widened, and the high-frequency serial resistance $R_s$ is reduced, so that the quality factor Q is enhanced.

2 Claims, 4 Drawing Sheets

VARIABLE-CAPACITANCE DIODE ELEMENT HAVING WIDE CAPACITANCE VARIATION RANGE

This is a division of application Ser. No. 07/466,204, filed Jan. 17, 1990 pending.

BACKGROUND OF THE INVENTION

1. Field of the Invention

This invention relates to a variable-capacitance diode element, and more particularly it pertains to such a diode element which is improved in respect of saturation tendency of the capacitance-voltage characteristics thereof and has the high-frequency serial resistance $R_s$ reduced so as to represent an enhanced quality factor Q.

2. Description of the Prior Art

Generally, most variable-capacitance diode elements are fabricated in the form of planar construction. Description will now be made of a conventional variable-capacitance diode element with reference to a fabricating process as illustrated in FIGS. 1(a) to (c).

In FIG. 1, an N-type semiconductor substrate 1 having a lower resistivity is prepared which is provided, by means of a vapor-phase growth process, with an N-type epitaxial layer 2 having a higher resistivity than that of the semiconductor substrate 1, say about 1 Ωcm and a thickness of about 4–5 μm (FIG. 1(a)). A major surface of the epitaxial layer 2 is subjected to a thermal oxidation treatment so that a thermally oxidized film (SiO$_2$) 3 is formed in a thickness of about 1 μm, and then an opening portion 6 is formed in the film 3 by means of an etching process. Subsequently, by means of an ion implantation process and under such conditions as acceleration voltage of 130 KeV and dosage of (2 to 3)×10$^{13}$ cm$^{-2}$, an N-type impurity element is implanted into the the epitaxial layer 2 through the opening portion 6 through which the major surface of the epitaxial layer 2 is exposed, thereby forming an N-type diffusion layer. It is also possible that the ion implantation may be effected in such a manner that the impurity element is implanted through an oxide film of 100–3000 Å. Thereafter, the resultant composite structure is subjected to a heat treatment which also serves to effect annealing for recovery of latice defects resulting from the ion implantation and carrier recovery, thus resulting in an N+-type diffusion layer 4 being formed which has a higher impurity concentration than that of the aforementioned epitaxial layer (FIG. 1(b)). Subsequently, a P++-type diffusion layer 5 is formed which has a smaller diffusion length than that of the diffusion layer 4 and covers the exposed portion of the diffusion layer 4 in such a manner that a PN junction is defined between the diffusion layer 5 and the diffusion layer 4 and epitaxial layer 2 (FIG. 1(c)). Electrodes are then provided at the top and bottom of the resulting composite structure respectively, and in this way, a variable-capacitance diode element is provided.

With reference to FIG. 2, explanation will be made of depletion layer of variable-capacitance diode element. Assuming that the impurity concentration of the P++-type diffusion layer 5 is sufficiently higher than that of the N+-type diffusion layer 4 and epitaxial layer 2, the width of depletion layer extending in the P++-type diffusion layer 5, when a reverse bias voltage $V_R$ is applied, becomes very small, i.e., negligible as compared with the width of depletion layer extending in the N+-type diffusion layer 4 and epitaxial layer 2. The variable capacitance $C_j$ of the variable-capacitance diode element is considered to consist of a combination of a junction capacitance $C_{j1}$ due to a depletion layer 7 resulting from the PN junction between the N+-type diffusion layer 4 and the P++-type diffusion layer 5 and a junction capacitance $C_{j2}$ due to a depletion layer 8 resulting from the PN junction between the epitaxial layer 2 and the diffusion layer 5. The impurity concentration of the epitaxial layer 2 is lower than that of the N+-type diffusion layer 4 so that the width of the depletion layer 8 of the epitaxial layer becomes greater than that of the depletion layer 7 of the diffusion layer 4. Furthermore, by increasing or decreasing the applied voltage $V_R$, the width of the depletion layer 7, 8 is increased or decreased so that the capacitance $C_{j1}$, $C_{j2}$ is varied, thus resulting in variable capacitance $C_j$ which consists of a combination of the capacitances $C_{j1}$ and $C_{j2}$ as mentioned above.

The variable capacitance of the variable-capacitance diode element is given by the following expressions:

$$W_j \propto \frac{2 K_s \epsilon_o \cdot (\Phi_B + V_R)^{1/n}}{q N (x)} \quad (1)$$

$$C_j \propto \frac{K_s \epsilon_o A}{W_j} \quad (2)$$

where $W_j$ is the width of depletion layer; N (x) is the impurity concentration; $K_S$ is the dielectric constant of the semiconductor substrate; $\epsilon_O$ is the dielectric constant in a vacuum (8.85×10$^{-12}$ F/m$^2$); q is electron charge (1.60×10$^{-19}$ C); $\Phi_B$ is the diffusion potential at the PN junction; n is a constant determined from the concentration gradient of the impurity element in the diode element; and A is the area of the diode element.

It will be seen from Equations (1) and (2) that the width of depletion layer depends on the impurity concentration of the semiconductor layer forming the PN junction with the P-type diffusion layer 5. Making an explanation with reference to FIG. 3, when reverse bias voltage $V_R$ is applied to the variable capacitance diode element, the width $W_{j2}$ of the depletion layer 8 in the epitaxial layer 2 the impurity concentration of which is lower than that of the diffusion layer, becomes greater than the width $W_{j1}$ of the depletion layer 7 in the diffusion layer 4; and as the applied voltage $V_R$ is increased, the depletion layer 8 is caused to extend until it contacts the semiconductor substrate 1, and further extension thereof is prevented.

A further explanation will be made with reference to the capacitance-voltage characteristics illustrated in FIG. 3. With the conventional variable-capacitance diode element, as shown by curve (I), if the applied voltage exceeds $V_O$, then the slope of the curve will become gentler so that saturation tendency be occur and thus the capacitance will be saturated at $C_S$. Such conventional variable-capacitance diode element is disadvantageous in that the depletion layer 8 extending from the periphery of the diffusion layer 4 is caused to extend into contact with the semiconductor substrate 1 and the rate of change of the capacitance $C_j$ with voltage becomes lower. Thus, it has so far been a task to increase the quality factor Q and improve the saturation tendency of the capacitance-voltage characteristics without increasing the high-frequency serial resistance $R_S$.

By increasing the thickness t of the epitaxail layer 2, it is possible to prevent the depletion layer 8 from extending into contact with the semiconductor substrate 1, thereby solving the aforementioned problem. However, such a procedure is disadvantageous in that the increase in the thickness of the epitaxial layer 2 immediately below the diffusion layer 4 results in the high-frequency serial resistance $R_S$ being increased so that the quality factor Q is decreased. Thus, it is not allowable to make the epitaxial layer 2 thicker than in the prior art.

SUMMARY OF THE INVENTION

The present invention as been made with a view to solving the above-mentioned problem, and it is an object of this invention to provide a variable-capacitance diode element which is improved in respect of saturation tendency of the capacitance-voltage characteristics thereof.

Another object of the present invention is to provide a variable-capacitance diode element having a decreased high-frequency serial resistance and an increased quality factor.

According to an aspect of the present invention, there is provided a variable-capacitance diode element comprising a semiconductor substrate of a first conductivity type having an epitaxial layer of the first conductivity type provided on a main surface thereof, said epitaxial layer having a higher resistivity than that of said semiconductor substrate; a first diffusion layer of the first conductivity type diffused in said epitaxial layer and having a lower resistivity than that of said epitaxial layer; a second diffusion layer of a second conductivity type surrounded by said first diffusion layer and having a lower resistivity than that of said first diffusion layer; and a third diffusion layer of the second conductivity type of a small diffusion length covering an exposed portion of a major surface of said first diffusion layer and an exposed portion of a major surface of said second diffusion layer. With such construction, the capacitance variation range of the diode element is widened, and the high-frequency serial resistance $R_S$ is reduced, so that the quality factor Q is enhanced.

Other objects, features and advantages of the present invention will become apparent from the ensuing description taken in conjunction with the accompanying drawings.

DESCRIPTION OF THE PREFERRED EMBODIMENTS

The variable-capacitance diode element according to the present invention will now be described on the basis of the method of making same, which is illustrated in FIG. 4.

Figure 4A:
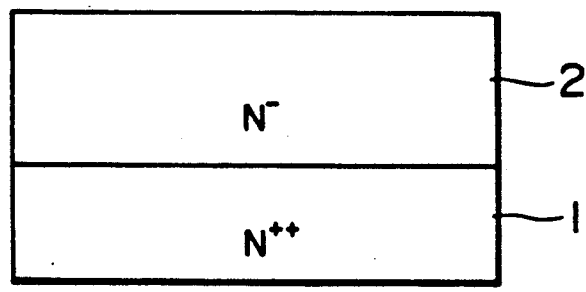
FIGS. 4(a) to (d) are sectional views useful for explaining the variable-capacitance diode element according to an embodiment of the present invention in terms of steps of a method of making same.
Figure 4B:
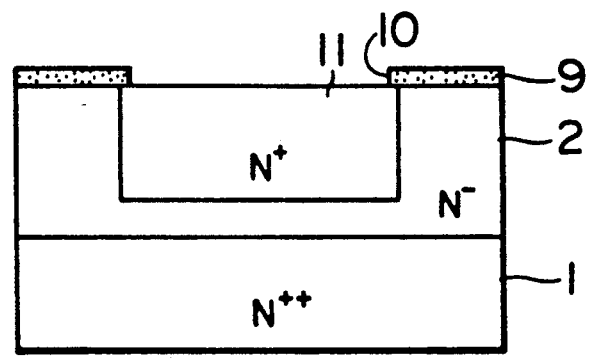
Figure 4C:
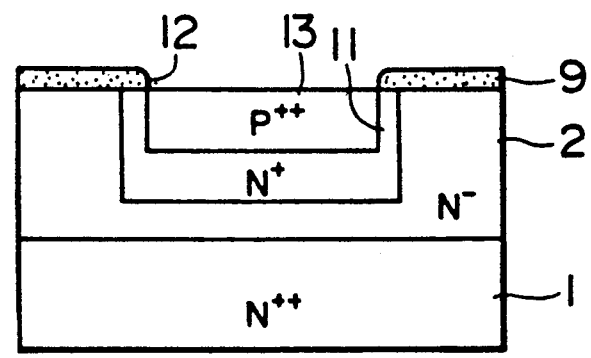
Figure 4D:
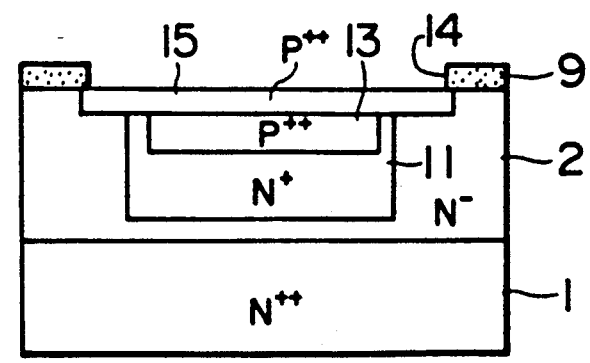

In FIG. 4, an N-type semiconductor substrate is prepared which is provided, by means of vapor-phase growth process, with an N-type epitaxial layer 2 having a higher resistivity than that of the semiconductor substrate, say about 1 $\Omega$cm, and having a thickness $t_1$ of 4 to 5 $\mu$m like the conventional variable-capacitance diode element (FIG. 4(a)). A thermally oxidized film ($SiO_2$) 9 is formed in a thickness of about 1 $\mu$m on the major surface of the epitaxial layer 2 by means of thermal oxidization process, and thereafter the thermally oxidized film is removed to form an opening portion 10 by means of an etching process. An N-type impurity element such as phosphorus, arsenic or the like is implanted into the epitaxial layer 2 through the opening portion 10 under such conditions as an accelerating voltage of 130 KeV and a dosage of (2 to 3)$\times 10^{13}$ cm$^{-2}$. Thereafter, the resultant composite structure is subjected to a heat treatment which also serves to effect annealing for recovery of latice defects resulting from the ion implantation and for carrier recovery, so that thermal diffusion is effected to form a diffusion layer 11 having a diffusion length in the range of 3 to 4 $\mu$m (FIG. 4(b)). A thermally oxidized film formed in the opening portion 10 due to the diffusion process is removed to form an opening portion 12. A P-type impurity element such as boron or the like is implanted into the diffusion layer 11 through the opening portion 12 under such conditions as accelerating voltage of 100 KeV and dosage of (5 to 8)$\times 10^{13}$ cm$^{-2}$, thereby forming a diffusion layer 13 in the diffusion layer 11 (FIG. 4(c)). For this diffusion procedure, it is also possible that use may be made of self-alignment technique to form the diffusion layer 13 through use of the opening portion 10 without providing the opening portion 12. Thereafter, the thermally oxidized film is removed to form an opening portion 14 through which the diffusion area of the diffusion layer 11 is exposed, and then P-type impurity element such as boron or the like is implanted through the opening portion 14 by means of ion implantation under such conditions as accelerating voltage of 20 KeV and dosage of (5 to 8)$\times 10^{13}$ cm$^{-2}$, thereby forming a P++ type diffusion layer 15 (FIG. 4(d)). In this diffusion layer 15, recovery of latice defects resulting from the ion implantation and carrier is effected by means of lamp-annealing procedure such as quick heat treatment using infrared radiation, or shallow diffusion technique. Subsequently, the resultant composite structure is provided with electrodes at the top and bottom thereof, and in this way, the variable-capacitance diode element is produced.

Figure 5:
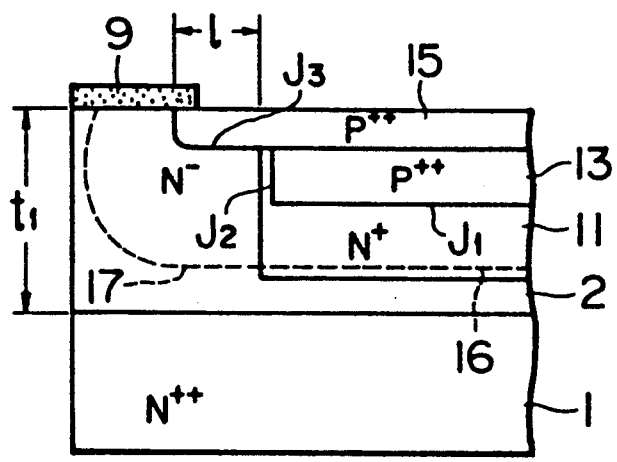
FIG. 5 is a sectional view illustrating the manner in which a depletion layer extends in the variable-capacitance diode element of the present invention.

In the variable-capacitance diode element according to the present invention, as shown in FIG. 5, the depletion layer extends in such a width that there occur a depletion layer 16 immediately below PN junction $J_1$ defined between the P++ type diffusion layer 13 and the N+ type diffusion layer 11, and a depletion layer 17 consisting of a combination of a depletion layer extending laterally from vertical PN junction $J_2$ between the diffusion layers 11 and 13 and a depletion layer associated with PN junction $J_3$ defined between the N− type epitaxial layer 2 and the P++ type diffusion layer 15.

With the construction according to the present invention. It is possible to restrain the depletion layer from tending to vertically extend more effectively than with the prior-art construction; thus, according to this embodiment of the present invention, the depletion layers 16 and 17 occur substantially in proportionment.

Figure 1A:
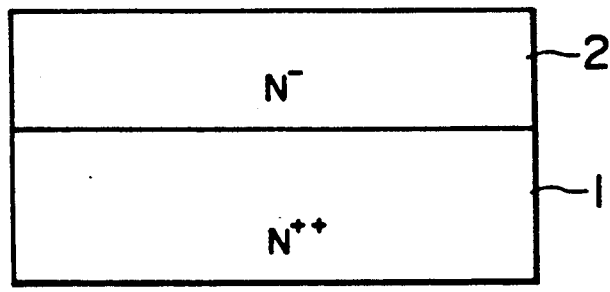
FIGS. 1(a) through (c) are sectional views useful for explaining a conventional variable-capacitance diode element in terms of steps of a method of making same.
Figure 1B:
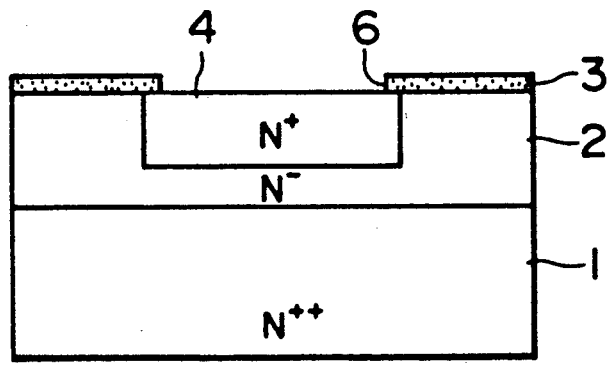
Figure 1C:
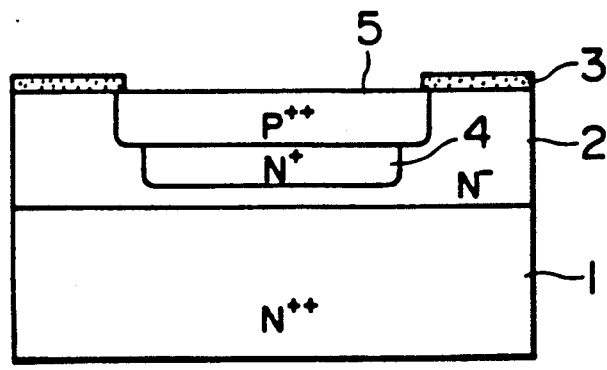
Figure 2:
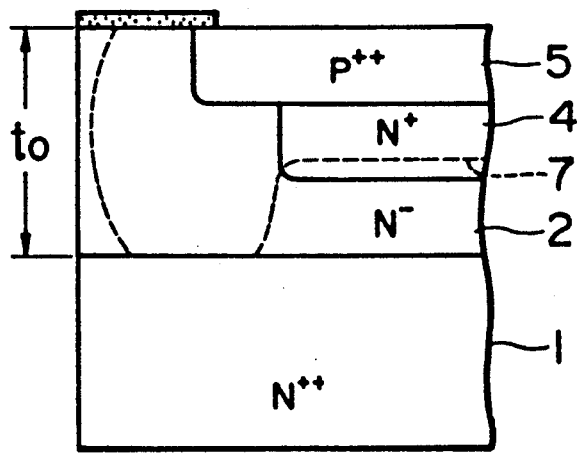
FIG. 2 is a fragmentary sectional view showing the conventional variable-capacitance diode element.
Figure 3:
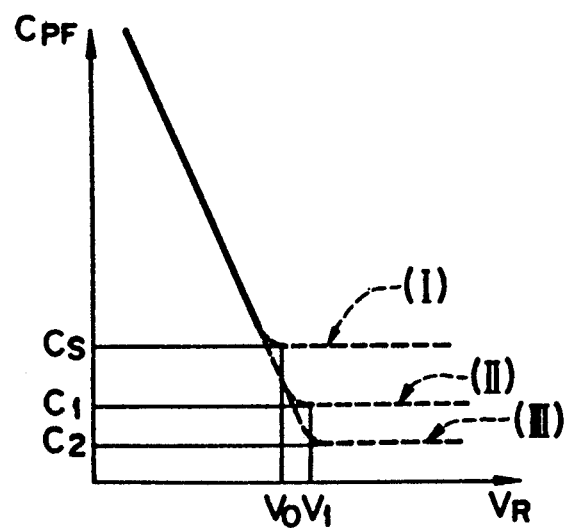
FIG. 3 illustrates the capacitance-voltage characteristics of a variable-capacitance diode element.

With the conventional variable-capacitance diode element, the capacitance-voltage characteristics are such that capacitance saturation occurs when the applied voltage $V_R$ reaches the value of $V_O$ as shown at (I) in FIG. 3. In contrast thereto, with the variable-capacitance diode element according to the present invention, the value of the applied voltage at which such capacitance saturation is increased up to $V_1$ as shown at (II) in FIG. 3. The diffusion length of the diffusion layer 15 can be shortened by virtue of the fact that the diffusion layer 15 is formed by means of lamp-annealing procedure, and the range in which the depletion layer is permitted to extend, can be correpondingly increased over the conventional variable-capacitance diode element. Thus, the range in which the capacitance is varied with applied voltage $V_R$, can be increased. Further, the value of applied voltage with which the capacitance $C_j$ becomes saturated, can be increased over the prior art, without increasing the thickness $t_1$ of the epitaxial layer 2. The high-frequency serial resistance R is not increased, and the quality factor Q is not decreased.

As will be appreciated, according to the embodiment of FIG. 4, vertical extension of the depletion layer is restrained so that the thickness $t_1$ of the eptixial layer 2 can be made to be less than the thickness $t_0$ of the epitaxial layer 2 of the conventional variable-capacitance diode element. Thus, by virtue of the fact that the thickness $t_1$ of the epitaxial layer 2 can be reduced, the high-frequency serial resistance $R_S$ can be decreased so that the quality factor Q can be enhanced.

Furthermore, by increasing the area A of the element by increasing the length l of that portion of the diffusion layer 15 which extends out of the diffusion layer 11, it is possible to increase the influence of the capacitance $C_{j2}$ which occurs laterally of the depletion layer 17, as will be appreciated from Equation (2). It is also possible to increase the variation rate of the combined capacitance $C_j$ with applied voltage. In other words, it is possible to establish the maximum capacitance of the element by adjusting the length l of the above-mentioned portion of the diffusion layer 15.

Figure 6:
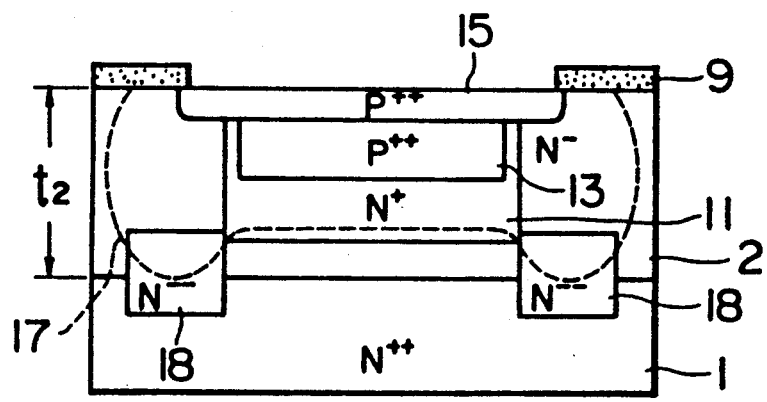
FIG. 6 is a fragmentary sectional view useful for explaining the variable-capacitance diode element according to another embodiment of the present invention.

Referring to FIG. 6, there is shown the variable-capacitance diode element according to another embodiment of this invention. With this embodiment, it is possible to make the epitaxial layer 2 thinner than with the embodiment of FIG. 4. More specifically, according to this embodiment, in addition to the features of the FIG. 4 embodiment, an $N^-$ type buried layer 18 is provided in the boundary portion between the semiconductor substrate 1 and the epitaxial layer 2 surrounding but except immediately below the $N^+$ type diffusion layer 11, i.e., in the portion into which the depletion layer extends. With such construction, by applying reverse bias voltage $V_R$, the depletion layer 17 is caused to extend deeply into the buried layer 18, and thus the saturation tendency is further improved over the embodiment of FIG. 4 as shown at (III) in FIG. 3. Furthermore, it is possible to make the epitaxial layer 2 thinner by virtue of the fact that the saturation tendency can be improved by providing the buried layer 18. Thus, the high-frequency serial resistance $R_S$ can be further decreased so that the quality factor Q can be enhanced accordingly.

Furthermore, by virtue of the fact that PN junction can be easily defined in the neighborhood of the major surface of the semiconductor substrate by forming shallow $P^{++}$ diffusion layer 15 by using shallow diffusion technique, or lamp annealing procedure, it is possible to make the $P^{++}$ diffusion layer 15 very thin without decreasing the break-down voltage of the element. Thus, the distance over which the depletion layer 17 reaches the semiconductor substrate 1, can be increased so that the epitaxial layer 2 can be made to be thinner than in the conventional variable-capacitance diode element; as a result, the high-frequency serial resistance $R_S$ can be decreased so that the quality factor Q can be increased.

The quality factor Q is given as follows:

$$Q \propto 1/\omega CR \qquad (3)$$

where $\omega$ represents angular frequency; C denotes capacitance; and R indicates resistance. The right-hand side term, or $1/\omega CR$ is given by the following expression:

$$1/\omega CR = 1/\omega C\,(\rho t/S) \qquad (4)$$

where S is the area of the element; $\rho$ is the resistivity of the element; and t is the thickness of the epitaxial layer 2. Assuming that $\omega C\rho/S$ is constant, Equation (4) can be rewritten as follows:

$$Q \propto 1/\omega CR = 1/tC_R \qquad (5)$$

As will be apparent from Equation (5), it is possible to enhance the quality factor Q by reducing the thickness of the epitaxial layer 2. The minimum value of the quality factor Q of a variable-capacitance diode element in which the thickness $t_0$ of the epitaxial layer 2 is 200, whereas in the embodiment of FIG. 6, the minimum value of the quality factor Q can be made to be as high as about 600 by setting the thickness $t_2$ of the epitaxial layer 2 at 4 $\mu$m.

As will be appreciated from the foregoing discussion, with the variable-capacitance diode element according to this invention, the saturation tendency thereof can be improved with the aforemetnioned configuration. For example, with the conventional variable-capacitance diode element, the capacitance-voltage characteristic thereof tends to become saturated when a voltage of about 20 V is applied thereto, whereas with the variable-capacitance diode element according to this invention, such characteristic does not become saturated until the applied voltage exceeds 25 V or higher. Thus, according to this invention, the epitaxial layer can be made to be thinner; as a result, the high-frequency serial resistance $R_S$ can be decreased so that the the quality factor Q can be.enhanced. The configuration according to the present invention is highly suitable for a variable-capacitance diode element which is intended to be used with a reverse bias voltage as low as several volts.

Another advantage of the variable-capacitance diode element according to the present invention is such that the maximum capacitance thereof can be easily set up on the basis of the extension portion l of the diffusion layer 15 which is made in a very thin form through lamp-annealing procedure.

While the present invention has been illustrated and described with respect to some specific embodiments thereof, it is to be understood that the present invention is by no means limited thereto but encompasses all changes and modifications which will become possible within the scope of the appended claims.

I claim:

1. A method of making a variable-capacitance diode element, comprising the steps of:

providing an epitaxial layer of a first conductivity type on a semiconductor substrate of the first conductivity type, said epitaxial layer having a higher resistivity than that of said semiconductor substrate;

implanting an impurity element of the first conductivity type deeply into said epitaxial layer by means of ion implantation and carrying out a first diffusion step, thereby forming a first diffusion layer;

implanting an impurity element of a second conductivity type into a area surrounded by said first diffusion layer, thereby forming a second diffusion layer of the second conductivity type which is shallower than said first diffusion layer and of a lower resistivity than that of said first diffusion layer; and forming a shallow diffusion layer of the second conductivity type by means of a lamp-annealing procedure in such a manner as to cover a KH portion of said first diffusion layer which is exposed at a major surface of said semiconductor substrate.

2. A method of making a variable-capacitance diode element, comprising the steps:

forming a first diffusion layer of a first conductivity type and having a high resistivity in a major surface portion of a semiconductor substrate of the first conductivity type, said first diffusion layer being adapted to serve as a buried layer;

providing an epitaxial layer of the first conductivity type on said semiconductor substrate, said epitaxial layer having a higher resistivity than that of said semiconductor substrate;

effecting a diffusion process to cause an impurity element of the first conductivity to be implanted deeply into said epitaxial layer by means of ion implantation, thereby forming a second diffusion layer;

implanting an impurity element of a second conductivity type into an area surrounded by said second diffusion layer, thereby forming a third diffusion layer of the second conductivity type which has a smaller diffusion length than that of said second diffusion layer and a lower resistivity than that of said epitaxial layer; and thereafter carrying out a lamp-annealing step to thereby form a fourth diffusion layer of the second conductivity type which covers said second diffusion layer and has a small diffusion length.

* * * * *